(12) United States Patent
Yang et al.

(10) Patent No.: US 7,462,902 B2
(45) Date of Patent: Dec. 9, 2008

(54) NONVOLATILE MEMORY

(75) Inventors: Ching-Sung Yang, Hsinchu (TW); Wei-Zhe Wong, Tainan (TW); Chih-Chen Cho, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 346 days.

(21) Appl. No.: 11/160,175

(22) Filed: Jun. 13, 2005

(65) Prior Publication Data

US 2006/0060910 A1  Mar. 23, 2006

(30) Foreign Application Priority Data

Sep. 17, 2004  (TW)  ................. 93128162 A (51) Int. Cl.
*H01L 27/108* (2006.01)

(52) U.S. Cl. .............. 257/304; 257/296; 257/E27.084; 257/301; 257/302; 257/71; 257/E21.646; 257/905; 257/906; 257/908; 257/314; 438/257

(58) Field of Classification Search ................. 257/314
See application file for complete search history.

(56) References Cited

U.S. PATENT DOCUMENTS

| 5,122,846 | A  | * | 6/1992  | Haken ........................ 257/66 |
| 5,364,812 | A  | * | 11/1994 | Yashiro et al. ............. 438/246 |
| 7,002,198 | B2 | * | 2/2006  | Salling et al. .............. 257/295 |
| 7,138,681 | B2 | * | 11/2006 | Forbes et al. .............. 257/316 |
| 2004/0130934 | A1 | * | 7/2004 | Prall et al. .................. 365/154 |

* cited by examiner

*Primary Examiner*—Zandra Smith
*Assistant Examiner*—Maliheh Malek
(74) *Attorney, Agent, or Firm*—Jianq Chyun IP Office (57) ABSTRACT

A nonvolatile memory is provided. The memory includes a select transistor and a trench transistor. The select transistor is formed on the substrate. The select transistor includes a first gate formed on the substrate and first and second source/drain regions formed in the substrate next to the first gate. The trench transistor is formed in the substrate. The trench transistor includes a second gate formed in the trench of substrate, an electron trapping layer formed between the second gate and the trench and second and third source/drain regions formed in the substrate next to the second gate. The select transistor and the trench transistor share the second source/drain region.

11 Claims, 7 Drawing Sheets

NONVOLATILE MEMORY

CROSS-REFERENCE TO RELATED APPLICATION

This application claims the priority benefit of Taiwan application serial no. 93128162, filed on Sep. 17, 2004. All disclosure of the Taiwan application is incorporated herein by reference.

BACKGROUND OF THE INVENTION

1. Field of the Invention

The present invention generally relates to a semiconductor memory device and a manufacturing method and an operating method thereof, and more particularly, to a nonvolatile memory and a manufacturing method and an operating method thereof.

2. Description of Related Art

While the manufacturing of semiconductor has progressed to the Deep Sub-Micron Process, the dimension of the devices is minimized; in terms of the memory, the size of memory cell is also getting smaller. On the other hand, with the increase of information to be processed and stored, the electronic products such as computers, mobile phones, digital cameras or personal digital assistants (PDAs) call for more memory capacity. As the size of the memory devices becomes smaller but the capacity requirement thereof is higher, how to make a memory device with minimized size, high integrity and quality is the main focus of the industry.

According to the read/write functions, memories can be divided into Read Only Memory (ROM) and Random Access Memory (RAM). Random Access Memory (RAM) is a volatile memory and is widely applied to the information electronic products. In general, Random Access Memory (RAM) includes the Static Random Access Memory (SRAM) and the Dynamic Random Access Memory (DRAM).

According to the design, DRAM memory cell usually comprises a transistor and a capacitor, and DRAM stores digital information by a charging status of the capacitor in the memory cell, which means DRAM uses charging and non-charging status of the capacitor to present [0] or [1] for binary data. Due to the possible leakage of the device, data stored in memory cell must be regularly refreshed, which consumes power. Besides, the data would disappear after the power is off.

SUMMARY OF THE INVENTION

Accordingly, the present invention is directed to a non-volatile memory and a manufacturing method and an operating method thereof, wherein the charge-trapping layer is disposed inside the DRAM for it to be volatile. In the present invention, the manufacturing process is simple and the cost is reduced.

The present invention is also directed to a non-volatile memory and a manufacturing method and an operating method thereof, wherein the digital data are judged according to the amount of the capacitance. Also, the present invention preserves the fast access function of DRAM.

The present invention provides a non-volatile memory. The non-volatile memory comprises a first memory cell, which comprises a substrate, a first transistor and a second transistor. The first transistor is disposed on the substrate. The first transistor comprises the first gate disposed on the substrate, and the first and the second source/drain regions disposed on the substrate at two sides of the first gate, respectively. The second transistor is disposed on the substrate. The second transistor comprises the second gate disposed on the substrate, the charge-trapping layer disposed between the substrate and the second gate, and the second and the third source/drain regions disposed on the substrate at two sides of the second gate, respectively. The first and the second transistors share the second source/drain region.

In the non-volatile memory mentioned above, the first gate of the first transistor is connected to the word line. The first source/drain region of the first transistor is connected to a bite line. The third source/drain region of the second transistor is floating located and the second gate of the second transistor is connected to the program line. A top dielectric layer is disposed between the charge-trapping layer and the second gate and a tunneling dielectric layer is disposed between the charge-trapping layer and the substrate, respectively.

Besides, in the volatile memory mentioned above, the second transistor can be a trench transistor. The second gate is disposed inside a trench of the substrate, and the charge-trapping layer is disposed between the second gate and the trench. The top dielectric layer is disposed between the charge-trapping layer and the second gate, while the tunneling dielectric layer is disposed between the charge-trapping layer and the trench.

In addition, the above-mentioned non-volatile memory may further comprise a second memory cell, which has the same structure as the first memory cell, and the select transistor of the second memory cell share the first source/drain region with the select transistor of the first memory cell.

In the non-volatile memory in the present invention, the select transistor is used to read the storage information generated by the written charge and transmit the programming or erase information from the bit line terminal. The trench transistor preserves the non-volatile memory function to store the write or erase information. The structure of the non-volatile memory in the present invention is similar to that DRAM, using the SONOS (silicon/silicon oxide/silicon nitride/silicon oxide/silicon) device (trench transistor) to replace the storage node of the conventional DRAM such that the memory cell can be non-volatile. Besides, the manufacturing process of this non-volatile memory is simple and is compatible with conventional DRAM manufacturing process, and thus the cost can be reduced.

The present invention provides a non-volatile memory operating method. The non-volatile memory at least comprises a select transistor and a trench transistor disposed on the substrate. The first source region of the select transistor is connected to the second drain region of the trench transistor, and the second drain region of the trench transistor is floating, while the second gate of the trench transistor fills the trench of the substrate. A charge-trapping layer is disposed between the trench and the second gate. This method comprises applying a first positive voltage on the first drain region of the select transistor before [1] is written into the memory during the programming operation, and applying a second positive voltage to the second gate of the trench transistor to form the channel inversion layer of the trench transistor. Then, the third positive voltage is applied on the first gate of the select transistor to turn on the select transistor. Thereafter, the bias voltage applied on the second gate of the trench transistor is increased from the second positive voltage to the fourth positive voltage, which raises the channel voltage of trench transistor, to prevent the F-N tunneling effect and avoid the electrons from entering the charge-trapping layer. During the programming operation, a zero volt bias voltage applied on the first drain region of the select transistor before [0] is written into the memory, and the second positive voltage is applied on the second gate of the trench transistor to form the channel inversion layer of the trench transistor. Then, a third positive voltage is applied on the first gate of the select transistor to turn on the select transistor. Later, the bias voltage applied on the second gate of the trench transistor is increased from the second positive voltage to the fourth positive voltage for the select transistor to generate the F-N tunneling effect and to allow the electrons into the charge-trapping layer.

During the above non-volatile memory operation, in the reading process, a fifth positive voltage is applied on the first drain region of the select transistor, and the sixth positive voltage is applied on the second gate of the trench transistor. Then, a seventh positive voltage is applied on the first gate of the select transistor to turn on the select transistor. If there are electrons inside the charge trapping area, while the sixth positive voltage is applied on the second gate of the trench transistor, the channel inversion layer of the trench transistor will not be formed and the induced capacitance will be lower. On the contrary, if there is no electron inside the charge trapping area, while the sixth positive voltage is applied on the second gate of the trench transistor, the channel inversion layer of the trench transistor will be formed and the induced capacitance will be higher.

During the operation of the above mentioned non-volatile memory, in the erasing process, a first negative voltage is applied on the second gate of the trench transistor, which expels the electrons inside the charge-trapping layer to the substrate through an F-N tunneling effect.

In the operation of the above mentioned non-volatile memory of the present invention, the digital information is judged by whether there are electrons in the charge-trapping layer and the capacitance generated therefrom. Therefore, the access mechanism of the non-volatile memory in the present invention is different from that of the DRAM or flash memory. Besides, the electrons stored in the charge-trapping layer will not likely be left out. Also, the non-volatile memory of the present invention is compatible with DRAM, but "refreshing" is not required. Therefore, the consumption of electric current is lower, thus reducing the power consumption of the whole memory.

The present invention further provides a manufacturing method for the non-volatile memory. First, a substrate with a gate structure formed thereon is provided, the gate structure comprising a first gate and a gate dielectric layer located between the first gate and the substrate. The first doping and the second doping region are formed on the substrate at two sides of the gate, respectively. A first insulating layer is formed on the substrate, and a portion of the first insulating layer and a portion of the substrate are removed to form a trench, which divides the second doping region into the third and the fourth doping region. Finally, a tunneling dielectric layer, a charge-trapping layer and a top dielectric layer are formed inside the trench, and a second gate which fills the trench is formed on the substrate.

The above manufacturing method of the non-volatile memory in the present invention further comprises forming a second insulating layer on the substrate and forming a bite line electrically connected to the first doping region on the second insulating layer.

The manufacturing method of the non-volatile memory in the present invention is compatible with that of DRAM. Besides, the process is simple and thus the cost can be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 1A:
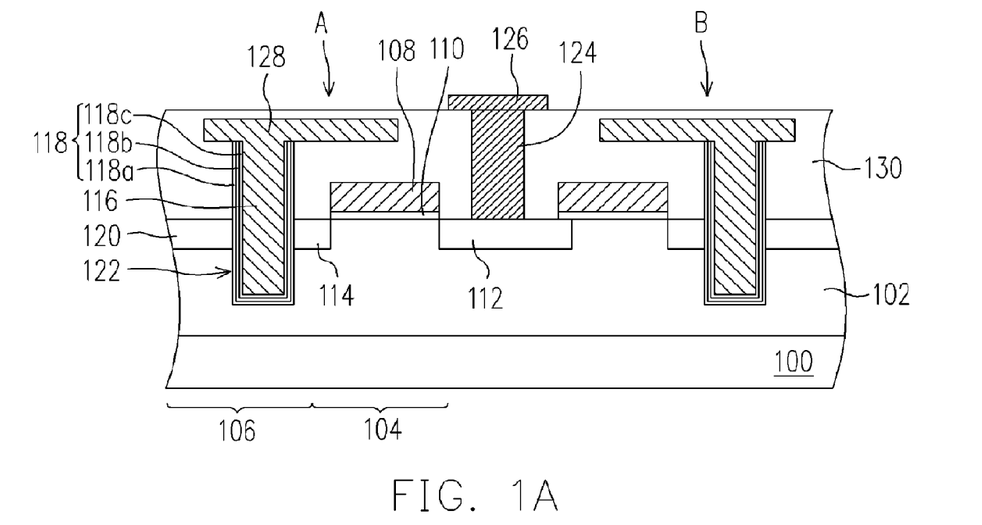
FIG. 1A and FIG. 1B are cross-sectional views of the structure for the non-volatile memory according to one embodiment of the present invention.

FIG. 1A is a cross-sectional view of the structure in the non-volatile memory according to one embodiment of the present invention.

Please refer to FIG. 1A, where the memory cell A and memory cell B sharing the same source/drain region 112 are shown. The non-volatile memory of the present invention can also be composed of a single memory cell with a source/drain region 112. As the memory cell A and B are the same, only memory cell A is described in the following.

The memory cell A comprises a substrate 100, a p-well 102, a select transistors 104 and a trench transistor 106.

The substrate 100's base can be a silicon base. The p-well 102 is located in the substrate 100.

The select transistor 104 is disposed on the substrate 100. The select transistor 104, for example, comprises a gate 108, a gate dielectric layer 110, a source/drain region 112, and a source/drain region 114.

The gate 108, made of doped polysilicon, for example, is disposed on the substrates 100, serving as the word line of memory cell A. Gate dielectric layer 110, made of silicon oxide, for example, is disposed between the gate 108 and the substrate 100. The source/drain region 112 and the source/drain region 114, whose doping type may be N-type, are disposed on the substrate 100 in the two sides of the gate 108, respectively. The source/drain region 112 of the select transistor 104 is connected to the bite line 126 through a plug 124.

The trench transistor 106 is disposed on the substrate 100. The trench transistor may comprise a gate 116, a compound dielectric layer 118, a source/drain region 114, and a source/drain region 120.

The gate 116, made of doped polysilicon, for example, is disposed inside the trench 122 on the substrate 100. The compound dielectric layer 118 comprises, for example, a tunneling dielectric layer 118a, a charge trapping layer 118b and a top dielectric layer 118c. The tunneling dielectric layer 118a can be made of silicon oxide. The charge-trapping layer 118b can be made of silicon nitride, or other materials which allow electrons to be trapped, such as tantalum oxide, strontium titanate and hafnium oxide layers. The top dielectric layer 118c can be made of silicon oxide. The source/drain region 114, and the source/drain region 120, whose doping type can be N-type, are disposed on the substrate 100 at two sides of the gate 116, respectively. Besides, the source/drain region 114 is shared by the trench transistor 106 and the select transistor 104, which means the source region of the select transistor 104 and the drain region of the trench transistor 106 are connected. The source/drain region 120 of the trench transistor 106 is floating and the gate 116 is connected to the program line 128.

In the non-volatile memory of the present invention, the select transistor is used to read the storage information generated by the written charge and to transmit the programming or erase information at the bit line terminal. The trench transistor, which preserves the function of a non-volatile memory, is used to store the write or erase information. Besides, the structure of the non-volatile memory of the present invention is similar to that of the DRAM, using the SONOS (silicon/ silicon oxide/silicon nitride/silicon oxide/silicon) device (trench transistor) to replace the storage node of the DRAM such that the memory cell of the present invention can be non-volatile.

Figure 1B:
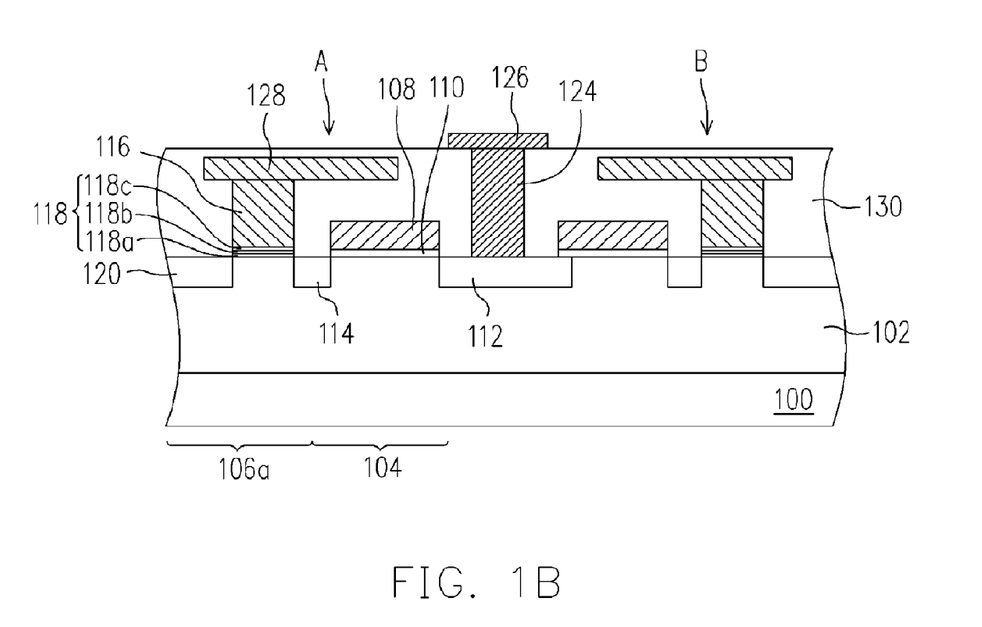

FIG. 1B illustrates the cross-sectional view of the structure of the non-volatile memory according to another embodiment of the present invention. In the present invention, the transistor for storing write or erase information is not limited to the trench transistor, but can be a transistor disposed on the substrate 100. In FIG. 1B, components identical to those in FIG. 1A are given same identification numbers and detailed description is not repeated.

Please refer to FIG. 1B. The transistor 106a is disposed on the substrate. The transistors 106a, for example, comprises a gate 116, a compound dielectric layer 118, a source/drain region 114, and a source/drain region 120. The gate 116 is disposed on the substrate 100. The compound dielectric layer 118 is disposed between the gate 116 and the substrate 100. The source/drain region 114 and the source/drain region 120, whose doping type can be N-type, for example, are disposed on the substrate 100 at the two sides of the gate 116, respectively. The select transistor 104 and the transistor 106a share the source/drain region 114.

In the non-volatile memory of the present invention, the select transistor is used to read the storage information generated by the written charge and transmit the programming or erase information at the bit line terminal. The trench transistor preserves the function of the non-volatile memory and is used to store the write or erase information. Besides, the structure of the non-volatile memory of the present invention is similar to that of DRAM, using the SONOS (silicon/silicon oxide/ silicon nitride/silicon oxide/silicon) device (trench transistor) to replace the storage node of the DRAM such that the memory cell of the present invention can be non-volatile.

FIG. 2A to FIG. 2E are cross-sectional views of the manufacturing process for the non-volatile memory according to one embodiment of the present invention.

Figure 2A:
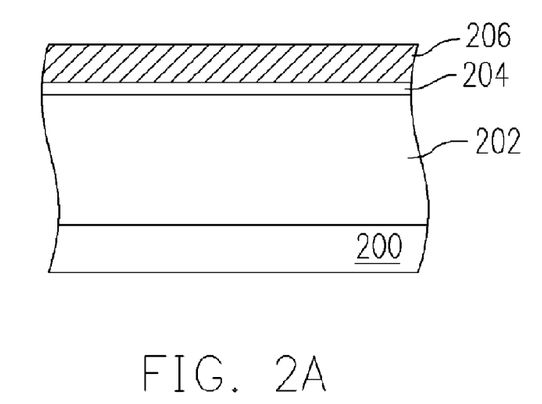
FIG. 2A to FIG. 2E are cross-sectional views of the manufacturing process for the non-volatile memory according to one embodiment of the present invention.

Please refer to FIG. 2A. A substrate 200, with a p-well 202 formed thereon, is provided. The base of the substrate 200 can be a silicon base. Then, a dielectric layer 204 and a conducting layer 206 are formed on the substrate sequentially. The material for dielectric layer 204 can be, for example, silicon oxide and the method for forming the dielectric layer 204 can be thermal oxidation. The material for the conducting layer 206 is, for example, doped polysilicon. The method of forming the conducting layer 206 can be by, for example, an in-situ doping process or a chemical vapor decomposition process to form an undoped polysilicon layer and then an ion implantation process.

Figure 2B:
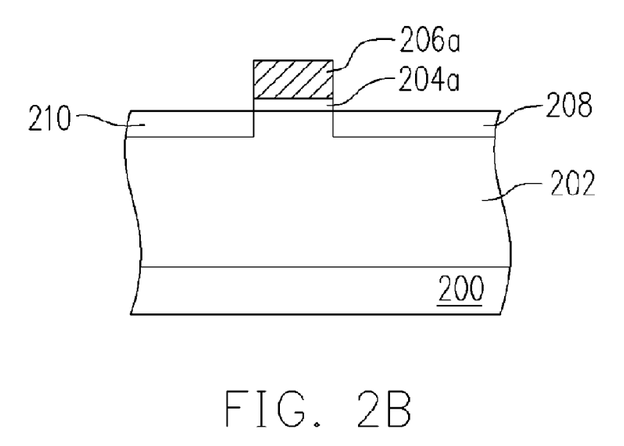

Please refer to FIG. 2B. The conducting layer 206 and the dielectric layer 204 are patterned to form the gate 206a and the gate dielectric layer 204a. Then, a doping process is performed to form doping region 208 and 210 on the substrate 200 in the two sides of the gate 206a. Wherein, the implanted dopant is, for example, N type.

Figure 2C:
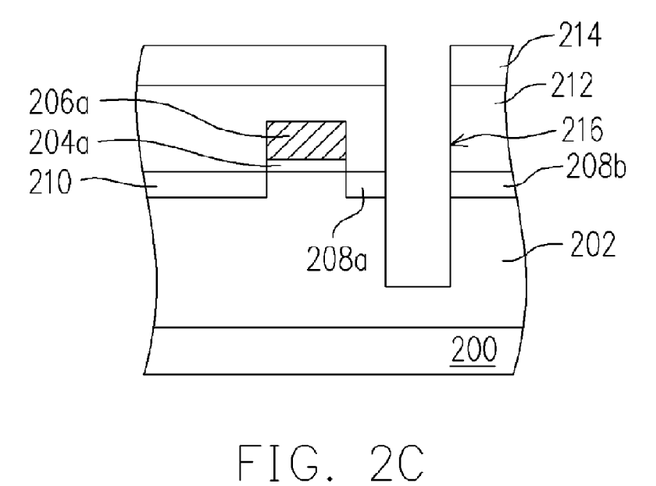

Please refer to FIG. 2C. After an insulating layer 212 is formed on the substrate 200, then a patterned mask layer 214 is formed on the insulating layer 212. Later, the patterned mask layer 214 is used to remove parts of the insulating layer 212 and parts of the substrate 200, to form the trench 216. The depth of the trench 216 should be deeper than that of the doping region 208, to separate the doping region 208 into doping region 208a and 208b. The material of the insulating layer is, for example, silicon oxide, and formed using Tetra-Ethyl-Ortho-Silicate (TEOS)/Ozone ($O_3$) as the reacting gas, in a chemical vapor decomposition process. The material for the mask layer 214 is, for example, photoresist materials.

Figure 2D:
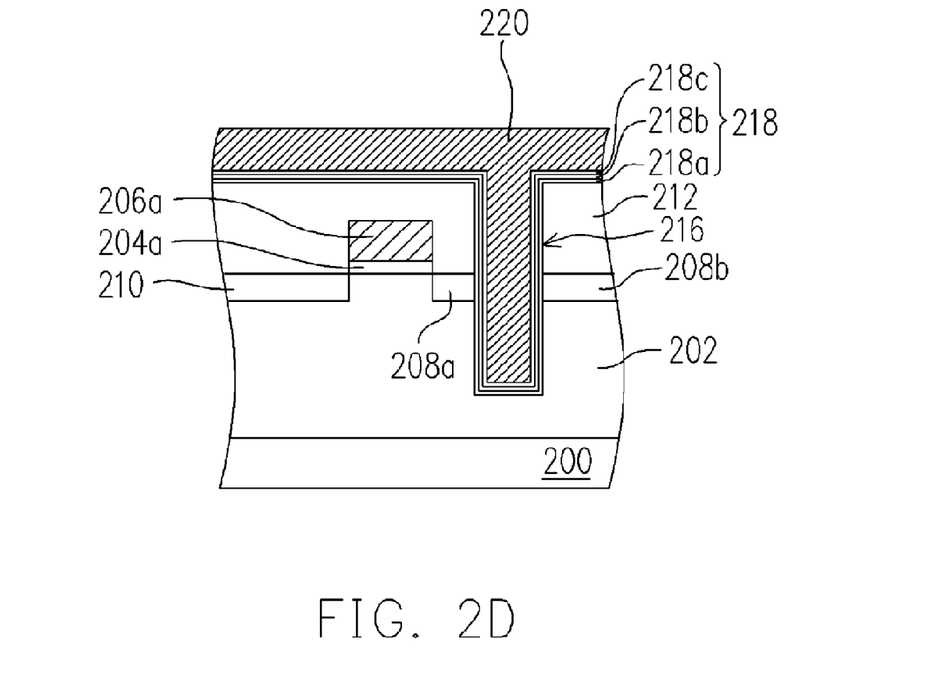

Please refer to FIG. 2D. After the patterned mask layer 214 is removed, a tunneling dielectric layer 218a, a charge-trapping layer 218b and a top dielectric layer 218c (compound dielectric layer 218) are formed on the substrate 200, sequentially. The material of the tunneling dielectric layer 218a can be, for example, silicon oxide and the method for forming the tunneling layer 218a can be thermal oxidation. The material of the charge-trapping layer 218b can be, for example, silicon nitride and the method for forming the charge-trapping layer 218b can be a chemical vapor decomposition process. The material of the top dielectric layer 218c can be, for example, silicon oxide and the method for forming the top dielectric layer 218c can be a chemical vapor decomposition process. Wherein, the materials of the tunneling layer 218a and the top dielectric layer 218c can be other similar materials. The material of the charge-trapping material 218b is not limited to silicon nitride, but can be other similar materials which allow the electrons to be trapped such as tantalum oxide, strontium titanate and hafnium oxide . . . etc. Then the conducting layer 220 is formed on the substrate 200 to fill the trench 216, and for the part which does not fill the trench 216 is used as the programming line. The material of the conducting layer 220 is, for example, doped polysilicon. The method for forming the conducting layer 220 is, for example, by an in-situ doping process or by a chemical vapor decomposition process to form an undoped polysilicon layer and then an ion implantation process.

Figure 2E:
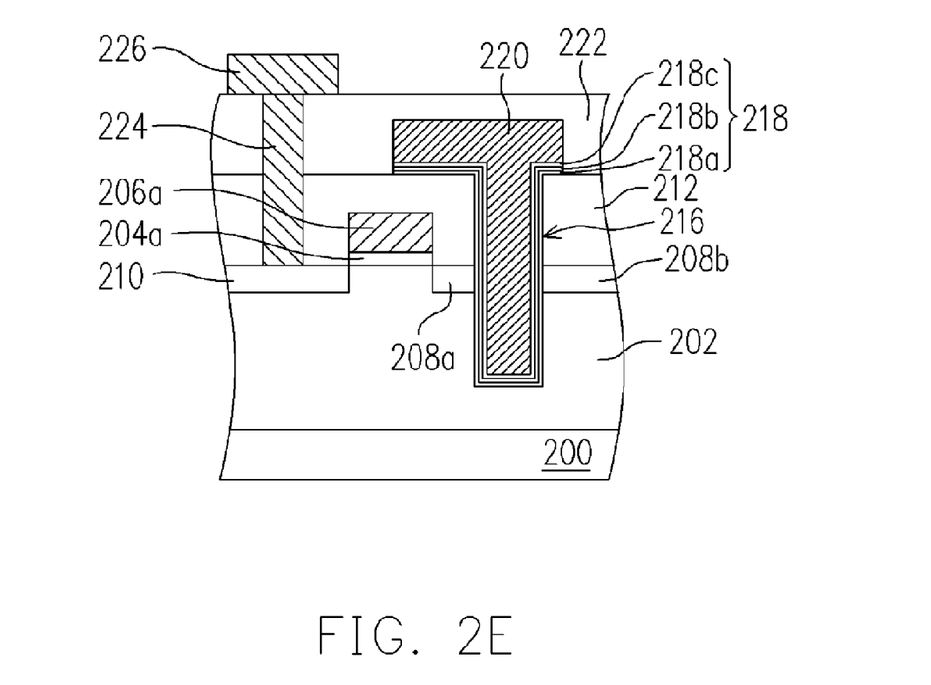

Please refer to FIG. 2E. After the conducting layer 220 and the compound dielectric layer 218 are patterned, another insulating layer 222 is then formed on the substrate 200. The material of the insulating layer 222 can be, for example, silicon oxide, formed using Tetra-Ethyl-Ortho-Silicate (TEOS)/Ozone ($O_3$) as the reacting gas in a chemical vapor decomposition process. Then a plug 224, which is electrically connected to the doping region 210, is formed between the insulating layer 222 and insulating layer 212 and then a conducting line 226 (bite line), which is electronically connected to the plug 224, is formed on the insulating layer 222.

The manufacturing method of the non-volatile memory of the present invention is compatible with that of the DRAM. Besides, the process is simple and thus cost can be reduced.

Figure 3A:
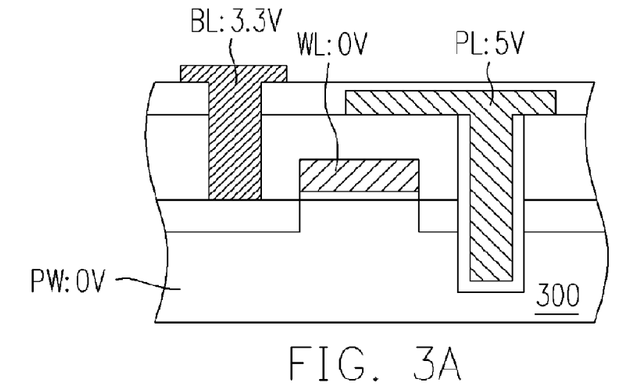
FIG. 3A to FIG. 3C are schematic illustrations of the programming operation when [1] is written in the non-volatile memory according to one embodiment of the present invention.
Figure 3B:
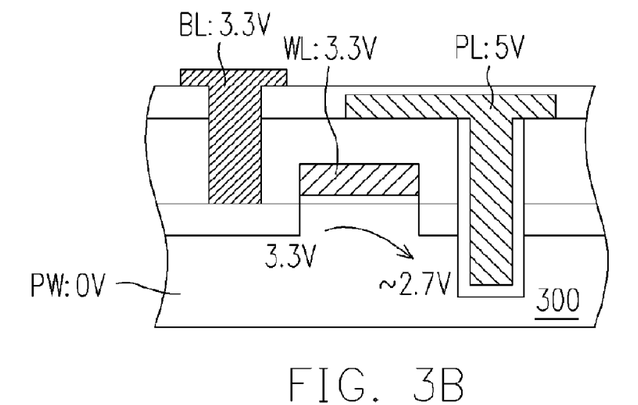
Figure 3C:
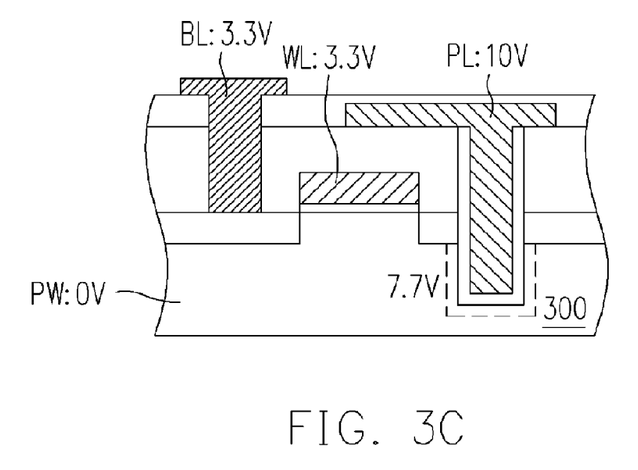
Figure 4A:
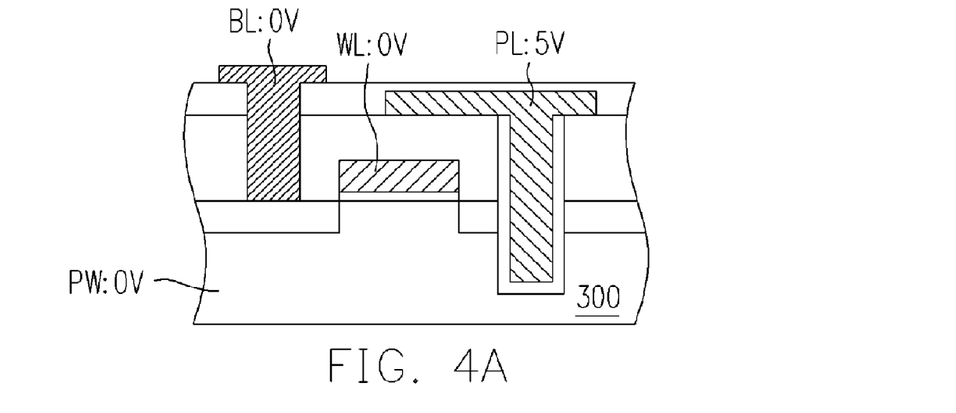
FIG. 4A to FIG. 4C are schematic illustrations of the programming operation when [0] is written in the non-volatile memory according to one embodiment of the present invention.
Figure 4B:
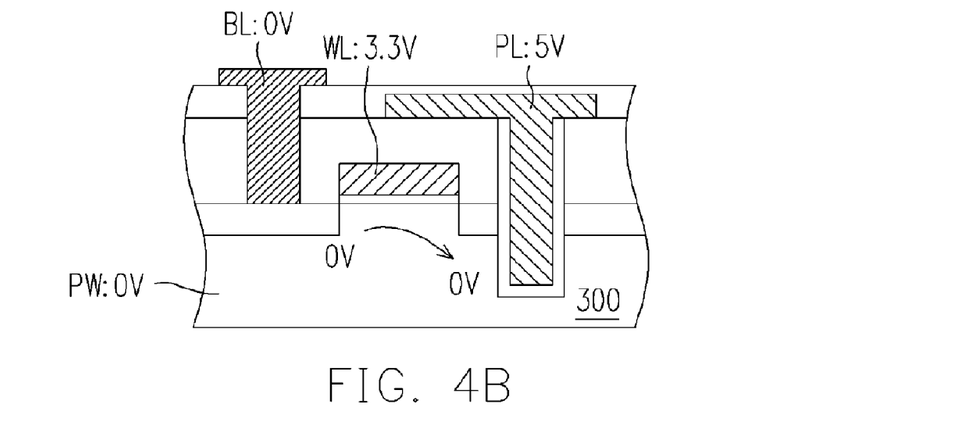
Figure 4C:
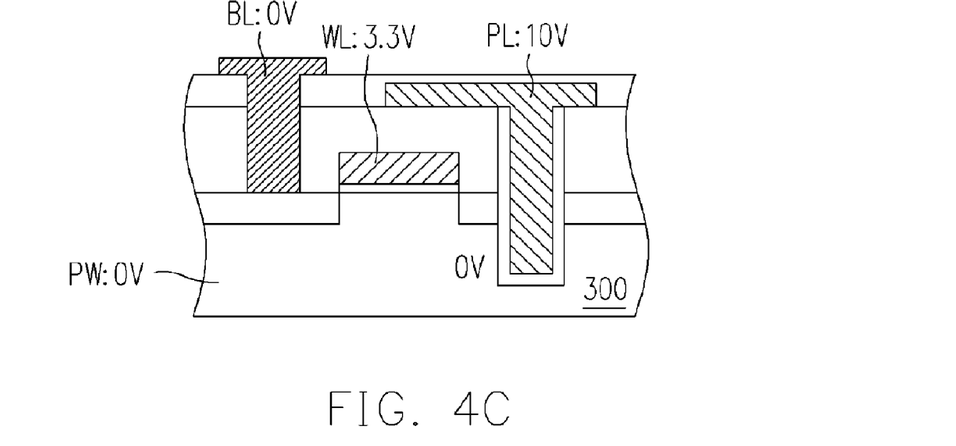
Figure 5A:
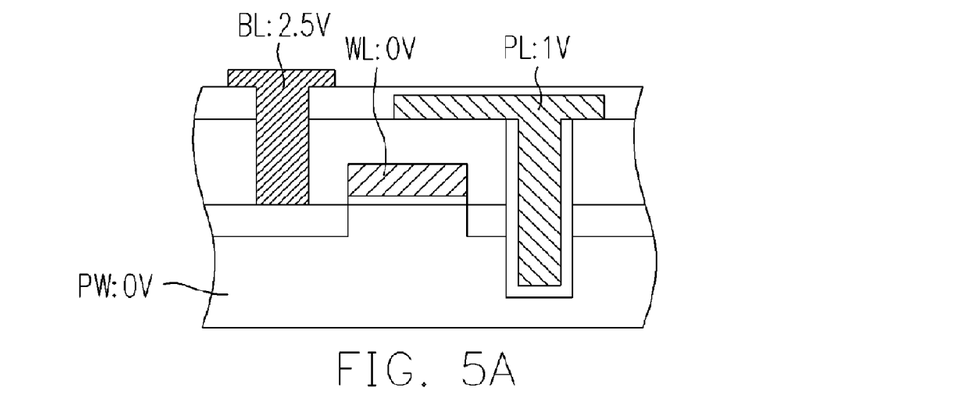
FIG. 5A to FIG. 5C are schematic illustrations of the read operation in the non-volatile memory according to one embodiment of the present invention.
Figure 5B:
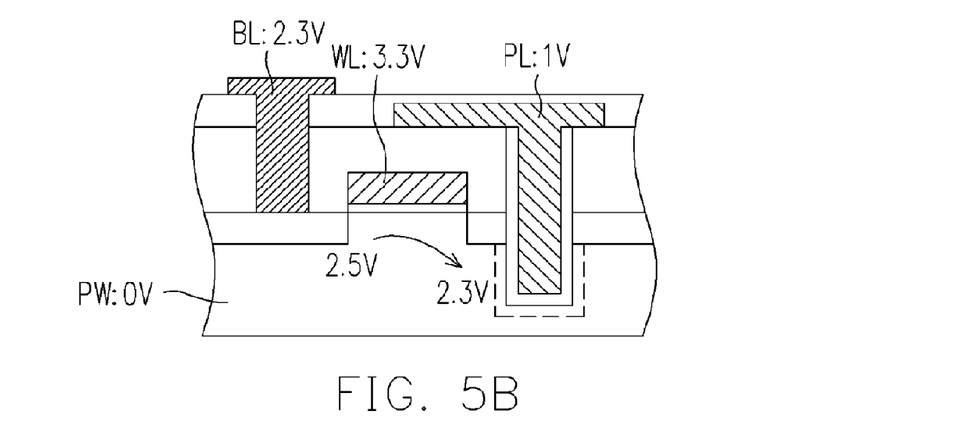
Figure 5C:
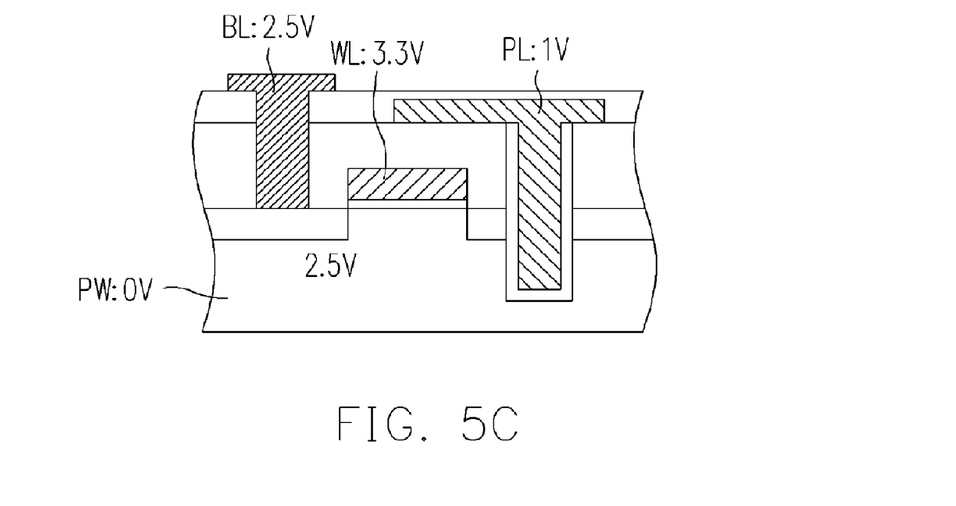
Figure 6:
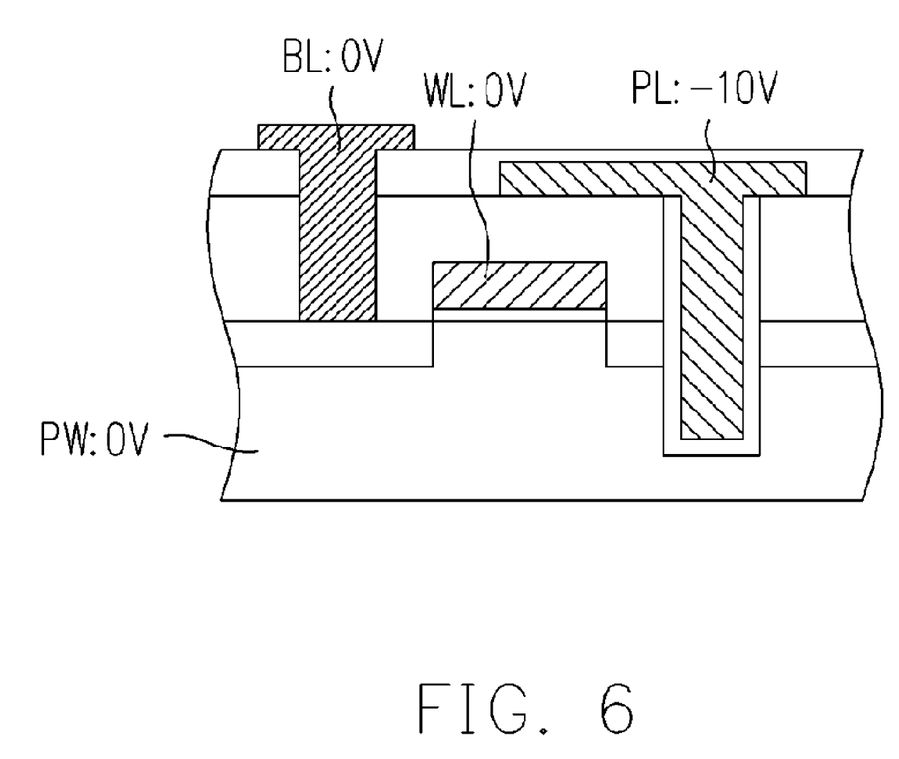
FIG. 6 is a schematic illustration of the erase operation in the non-volatile memory according to one embodiment of the present invention.

In the following, the operating method of the present invention is discussed. FIG. 3A to FIG. 3C are schematic illustrations of the programming operation when [1] is written in the non-volatile memory according to one embodiment of the present invention, while the FIG. 4A to FIG. 4C are schematic illustrations of the programming operation when [0] is written in the non-volatile memory according to one embodiment of the present invention. FIG. 5A to FIG. 5C are schematic illustrations of the read operation in the non-volatile memory according to one embodiment of the present invention. FIG. 6 is a schematic illustration of the erase operation in the non-volatile memory according to one embodiment of the present invention.

First, the programming operation when [1] is written in the non-volatile memory according to one embodiment of the present invention is discussed.

Please refer the FIG. 3A. A voltage, such as 3.3 volt, is applied on a bite line BL (a drain region of a select transistor), and another voltage such as 5 volt is applied on a program line PL (a gate of a trench transistor) to form the channel inversion layer of the trench transistor.

Please refer FIG. 3B. A voltage, such as 3.3 volt, is applied to a word line WL (a gate of a select transistor) to turn on the select transistor, then the electrons in the drain region of the select transistor can reach the trench transistor through the channel of the select transistor, and the voltage is reduced from 3.3 volt to about 2.7 volt.

Please refer to FIG. 3C. The bias voltage applied on the program line PL (a gate of the trench transistor) is increased from 5 volt to 10 volt, and then the voltage on channel of the trench transistor is increased from 2.7 volt to about 7.7 volt to avoid the F-N tunneling effect. Accordingly, no electrons would enter the charge-trapping layer and the memory cells are programmed to the [1] state.

The programming operation when [0] is written in the non-volatile memory according to one embodiment of the present invention is discussed in the following.

Please refer to FIG. 4A. A voltage, such as 0 volt, is applied on a bite line BL (a drain region of a select transistor), and another voltage, such as 5 volt, is applied on a program line PL (a gate of a trench transistor) to form the channel inversion layer of the trench transistor.

Please refer to FIG. 4B. A voltage, such as 3.3 volt, is applied to a word line WL (a gate of a select transistor) to turn on the transistor. Then, the electrons in the drain region of the select transistor can reach a trench transistor through the channel of the select transistor, and the voltage is 0 volt.

Please refer to FIG. 4C. The bias voltage of the program line PL (a gate of the trench transistor) is increased from 5 volt to 10 volt, generating a huge voltage drop between the trench transistor and the substrate and thus leading to the F-N tunneling effect. Therefore, electrons would enter the charge-trapping layer such that the memory cells are programmed to the [0] state.

The read operation in the non-volatile memory according to one embodiment of the present invention is discussed in the following.

Please refer to FIG. 5A. A voltage, such as 2.5 volt, is applied on a bite line BL (a drain region of a select transistor), and another voltage, such as 1 volt, is applied on a program line PL (a gate of a trench transistor) to form the channel inversion layer of the trench transistor.

Then, a voltage, such as 3.3 volt, is applied on a word line WL (a gate of a select transistor) to turn on the select transistor. If there is no electron inside the charge-trapping layer, then this charge-trapping layer will be in an empty state or a positive charge state, leading to surface inversion in the p-well area. Thus, the channel of the trench transistor will be electrically connected to induce more capacitance as shown in FIG. 5B. When there are electrons inside the charge trapping layer, the stored electrons will turn the charge trapping layer into a negative charge state, leading to surface depletion of the p-well. Therefore, the channel of the trench transistor will not be connected and the capacitance induced will be smaller as shown in 5C. A non-conductive channel of the trench transistor with negative total charge in the charge-trapping layer would induce less capacitance. However, a non-conductive channel of the trench transistor with slightly positive total charge in the charge-trapping layer would induce more capacitance. Therefore, the amount of induced capacitance can be used to judge whether the digital information stored in the memory cells are in the [1] or [0] state.

The erase operation in the non-volatile memory according to one embodiment of the present invention is discussed in the following paragraphs.

Please refer to FIG. 6. A voltage, such as −10 volt, is applied on the program line PL (a gate of a trench transistor), which expels the electrons inside the charge-trapping layer to the substrate through an F-N tunneling effect. Then the data inside the memory cell will be erased.

In the operating method of the non-volatile memory in the present invention, the digital information is judged by whether there are electrons in the charge-trapping layer and the amount of capacitance induced. Therefore, the access mechanism of the non-volatile memory in the present invention is different from that of the DRAM or flash memory. Besides, the electrons stored in the charge-trapping layer are not likely to be left out. Compared with the conventional DRAM, the non-volatile memory of the present invention does not require the "refreshing" process. Therefore, the consumption of the electric current is less and power consumption for the whole memory can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a substrate; and
   a first memory cell, the first memory cell including a first transistor disposed on the substrate and a second transistor disposed next to the first transistor, and the first transistor further comprising:
      a first gate, disposed on the substrate;
      a single gate dielectric layer, disposed between the first gate and the substrate; and
      a first source/drain region and a second source/drain region, disposed on the substrate at two sides of the first gate, respectively, and the second transistor further comprising:
      a second gate, disposed on the substrate;
      a compound dielectric layer, disposed between the second gate and the substrate; and
      a third source/drain region and the second source/drain region, disposed on the substrate at two sides of the second gate, respectively wherein the second transistor and the first transistor share the second source/drain region,
   wherein the compound dielectric layer comprises a first charge trapping layer, and the first transistor is used to read storage information stored in the second transistor and transmit programming or erase information to the second transistor.

2. The non-volatile memory of claim 1, wherein the memory further comprises a word line, connected to the first gate of the first transistor.

3. The non-volatile memory of claim 1, wherein the memory further comprises a bite line, connected to the first source/drain region of the first transistor.

4. The non-volatile memory of claim 1, wherein the memory further comprises a program line, connected to the second gate of the second transistor.

5. The non-volatile memory of claim 1, wherein the compound dielectric layer further comprises:
   a top dielectric layer, disposed between the first charge trapping layer and the second gate;
   a tunneling dielectric layer, disposed between the first charge trapping layer and the substrate.

6. The non-volatile memory of claim 1, wherein a material of the first charge trapping layer comprises silicon nitride.

7. The non-volatile memory of claim 5, wherein a material of the top dielectric layer and the tunneling dielectric layer comprises silicon oxide.

8. The non-volatile memory of claim 1, wherein a material of the first and the second gates comprises doped polysilicon.

9. The non-volatile memory of claim 1, wherein the second transistor is a trench transistor and the second gate is disposed in a trench of the substrate, and the first charge-trapping layer is disposed between the second gate and the trench.

10. The non-volatile memory of claim 9, wherein the memory further comprising:
    a top dielectric layer, disposed between the first charge trapping layer and the second gate; and
    a tunneling dielectric layer, disposed between the first charge-trapping layer and the trench.

11. The non-volatile memory of claim 1, wherein the memory further comprises a second memory cell, the second memory cell including a third transistor disposed on the substrate and a fourth transistor disposed next to the third transistor, and the third transistor further comprising:
    a third gate, disposed on the substrate; and
    the first source/drain region and a fourth source/drain region, disposed on the substrate at two sides of the third gate, respectively, and the fourth transistor further comprising:
    a fourth gate, disposed on the substrate;
    a second charge-trapping layer, disposed between the fourth gate and the substrate; and
    a fifth source/drain region and the fourth source/drain region, disposed on the substrate at two sides of the fourth gate, respectively, wherein the third transistor and the fourth transistor share the fourth source/drain region, and wherein the third transistor of the second memory cell and the first transistor of the first memory cell share the first source/drain region.

* * * * *